Figure 1A:
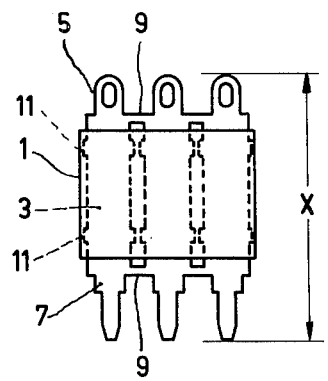

United States Patent [19]

van der Donk et al.

[11] 4,090,293
[45] May 23, 1978

[54] METHOD OF MANUFACTURING AN ELECTRICAL COMPONENT COMPRISING CONNECTION TAGS

[75] Inventors: Johannes Martinus Augustinus H. van der Donk; Jacob Jan de Kok, both of Eindhoven, Netherlands

[73] Assignee: U.S. Philips Corporation, Briarcliff Manor, N.Y.

[21] Appl. No.: 751,444

[22] Filed: Dec. 16, 1976

[30] Foreign Application Priority Data

Jan. 12, 1976 Netherlands .................. 7600236

[51] Int. Cl.² ........................................... H01R 43/00
[52] U.S. Cl. ................................. 29/628; 113/116 Y; 113/116 V; 339/218 R
[58] Field of Search ............ 29/622, 628, 629, 630 R, 29/624, 33 S, 33 K, 33 Q; 339/218 R, 218 C, 218 L, 218 M; 113/116 P, 116 Y, 116 V

[56] References Cited

U.S. PATENT DOCUMENTS

| | | | |
|---|---|---|---|
| 3,413,713 | 12/1968 | Helda | 29/576.5 |
| 3,436,810 | 4/1969 | Kauffman | 29/591 X |
| 4,012,835 | 3/1977 | Wallick | 29/628 X |

Primary Examiner—Victor A. DiPalma
Attorney, Agent, or Firm—Frank R. Trifari; Rolf E. Schneider

[57] ABSTRACT

In the manufacture of an electrical component comprising a housing of a synthetic material and a row of connection tags, a strip material is punched to form a comb or grid in which the connection tags are interconnected by connection pieces extending between each two adjacent connection tags. After moulding the housing of synthetic material, the connection pieces, which are then situated between the free ends of the connection tags and the housing, are cut on one side and are subsequently bent so that they remain connected to the connection tags as harmless protrusions.

1 Claim, 5 Drawing Figures

METHOD OF MANUFACTURING AN ELECTRICAL COMPONENT COMPRISING CONNECTION TAGS

This invention relates to a method of manufacturing an electrical component comprising a housing of a synthetic material and at least one row of strip-like connection tags formed from a strip material, which comprises the following steps:

a. punching the strip material to form a comb or grid which contains the connection tags interconnected by connection pieces, b. forming the housing of synthetic material in such a manner so that a portion of each of the connection tags is anchored in the housing whilst leaving a free end of each tag together with the connection pieces external of the housing, and c. separating the connection tags from each other.

The component may be, for example, a slide switch as described in British Pat. No. 1,397,212, . In that case the connection tags may be integral with the fixed contacts of the switch which co-operate with movable contacts accommodated on a contact slide movable in the housing.

The housing may be formed in such a way that the comb or grid including the connection tags is introduced into a mould (the connection tags and the connection pieces projecting outside the mould cavity) and a mass of synthetic material is injected into the mould to form the housing in which the connection tags are partly anchored. Alternatively, the housing can be assembled from a number of previously moulded parts, the connection tags then being located partly between two parts of the housing (see, for example, U.S. Pat. No. 3,242,273.

The connection pieces may be formed in such a way that the strip from which the connection tags are made is wider than necessary for forming the connection tags and the contacts connected thereto. On both sides (or on one side) of the strip an uninterrupted strip of material then remains after punching, the said strip being connected to the various connection tags via bridges. This method involves the drawback that the strip must be extra wide, so that a substantial loss of material occurs. The present invention has for its object to provide a method which offers minimum loss of material due to the connection pieces.

To this end, the method in accordance with the invention is characterized in that each connection piece extends between two adjacent connection tags and in its entirety is situated nearer to the housing than the ends of these connection tags, the separation of the connection tags being effected in such a way that each connection piece is cut in only one location, so that on at least one of every two adjacent connection tags at least one protrusion remains which is subsequently bent to enclose an angle with the plane of the connection tags.

Thus, the strip need not be wider than necessary for forming the connection tags and contacts per se. In principle, the separation of adjacent connection tags could also be effected by cutting each connection piece at two locations, i.e. the two areas of attachment to the relevant connection tags. However, it has been found that the released connection pieces which together represent a very large quantity of very small pieces of metal, may penetrate between moving machine parts where they may cause damage. When use is made of the method in accordance with the invention, the connection pieces remain connected to the connection tags, so that they cannot have a disturbing effect.

Figure 2A:
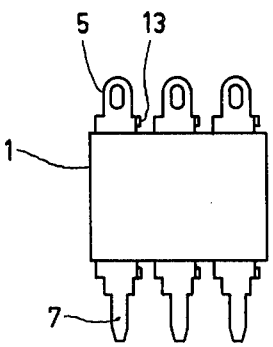
Figure 1B:
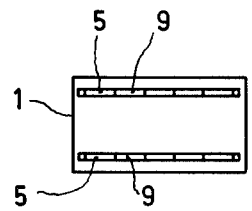
Figure 2B:
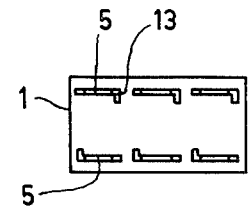
Figure 3:
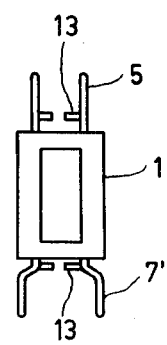

The invention will now be described in detail with reference to the accompanying drawing, in which:

FIG. 1a is a side elevation of an embodiment of an electrical component in accordance with the invention, prior to the separation of the connection tags, FIG. 1b is a plan view of the component shown in FIG. 1a, FIG. 2a is a side elevation of the component shown in FIG. 1a, after the separation of the connection tags, FIG. 2b is a plan view of the component shown in FIG. 2a, and FIG. 3 is an end view of a further embodiment.

The electrical component shown in FIG. 1a and FIG. 1b consists of a housing 1 of a synthetic material in which fixed contacts 3 are provided (denoted by broken lines). The housing can accommodate a contact slide (not shown), comprising movable contacts in order to form a slide switch. The contacts 3 are made of plate material and are integral with upper connection tags 5 and lower connection tags 7. Adjacent connection tags 5, 7 are initially connected to each other by connection pieces 9. The contacts 3, the connection tags 5, 7 and the connection pieces 9 are formed from a metal strip by punching. Because the connection pieces 9 are situated between the free ends of the connection tags 5, 7 and the housing 1, this strip need in principle not be wider than the sum of the length of an upper connection tag 5, a contact 3 and a lower connection tag 7. This width is denoted by the reference X in FIG. 1a.

The punched strip is subsequently arranged in a mould (not shown) in which the housing 1 of synthetic material is moulded. The part of each connection tag 5, 7 which is present in the mass of synthetic material includes projections 11 (denoted by broken lines) in order to anchor the contacts and the connection tags, so that the position of the contacts and the connection tags relative to each other is fixed after the moulding of the housing 1, even after removal of the connection pieces 9.

After the moulding of the housing 1, the connection pieces 9 are cut on one side by means of a suitable tool and are subsequently bent so that strip-like protrusions 13 are formed, the plane of which encloses an angle with the direction of the row of connection tags 5, 7 which corresponds to the longitudinal direction of the housing 1 (see FIG. 2a and FIG. 2b). This angle amounts to approximately 90° in the embodiment shown. However, it will be obvious that any angle suffices which ensures a distance between adjacent connection tags which is adequate for insulation purposes. The overall length of each protrusion 13 substantially equals the distance between two adjacent connection tags. Thus, complete and reliable electrical separation between adjacent connection tags 5, 7 is obtained without the formation of loose pieces of metal which could have an adverse effect as has already been stated.

Following this operation, the connection tags can be bent in any desired shape, for example, as denoted by 7' in FIG. 3. Alternatively, they can be bent at right angles (not shown) or remain straight as shown in FIG. 2a.

The embodiments described relate to the manufacture of a housing for a slide switch. It will be obvious that the same method can be used for manufacturing any housing of synthetic material which includes one or more rows of connection tags such as, for example, an envelope of synthetic material for an integrated circuit or a connector for receiving a printed wiring board.

In the described embodiments, each connection piece is cut on one of its ends. Obviously, the connection piece can also be cut, for example, in the middle and the two parts thus obtained can be bent.

We claim:

1. A method of manufacturing an electrical component comprising a housing of a synthetic material and at least one row of connection tags formed from a strip material, which comprises punching the strip material to form a comb or grid which contains the connection tags interconnected by connection pieces, forming the housing of synthetic material in such a manner that a portion of each of the connection tags is anchored in the housing while leaving a free end of each tag together with the connection pieces external of the housing, each connection piece extending between two adjacent connection tags and in its entirety being situated nearer to the housing than the ends of the connection tags, separating the connection tags by cutting each connection piece in only one location so that on at least one of every two adjacent connection tags at least one protrusion remains, and subsequently bending each protrusion to enclose an angle with the plane of the connection tags.

* * * * *